(12) United States Patent
Symanczyk

(10) Patent No.: US 7,307,868 B2
(45) Date of Patent: Dec. 11, 2007

(54) INTEGRATED CIRCUIT INCLUDING MEMORY CELL FOR STORING AN INFORMATION ITEM AND METHOD

(75) Inventor: Ralf Symanczyk, München (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 11/107,182

(22) Filed: Apr. 15, 2005

(65) Prior Publication Data

US 2005/0243596 A1    Nov. 3, 2005

(30) Foreign Application Priority Data

Apr. 17, 2004    (DE) .................. 10 2004 018 715

(51) Int. Cl.
*G11C 11/00*    (2006.01)
(52) U.S. Cl. .................. 365/148; 365/189.01
(58) Field of Classification Search ............... 365/148, 365/189.01
See application file for complete search history.

(56) References Cited

U.S. PATENT DOCUMENTS

2003/0168651 A1*  9/2003  Kozicki ........................ 257/2
2004/0124407 A1*  7/2004  Kozicki et al. ............... 257/9
2005/0127524 A1*  6/2005  Sakamoto et al. .......... 257/774
2006/0126413 A1*  6/2006  Liaw ........................ 365/210

OTHER PUBLICATIONS

German Patent Office Examination Report dated Feb. 22, 2005.
M. N. Kozicki, M. Yun, L. Hilt, ,A.Singh, *Applications Of Programmable Resistance Changes in Metal-Doped Chalconides*, Electrochemical Society Proc., vol. 99-13 (1999), pp. 298-309.
R. Neale, *Micron To Look Again At Non-Volatile Amorphous Memory*, Electronic Engineering Design (2002).
B. Price, *Chalcogenic Memories*, Emerging Memories—Technologies and Trends, Kluwer Academic Publishers (2002), pp. 254-257.
R. Symanczyk et al., *Electrical Characterization of Solid State Ionic Memory Elements*, Proceedings of the Non-Volatile Memory Technology Symposium, 17-1, San Diego, CA (2003).

* cited by examiner

*Primary Examiner*—Michael T Tran
(74) *Attorney, Agent, or Firm*—Dicke, Billig & Czaja, P.L.L.C.

(57) ABSTRACT

The invention relates to a memory cell for providing an information item, having a memory element, which has a PMC resistance component with a solid electrolyte material. The solid electrolyte material may be put into a first state with a high electrical resistance and into a second state with a low electrical resistance. The memory element has a resistance element which is connected up to the PMC resistance component in such a way as to reduce the total resistance of the memory element in the first state.

19 Claims, 3 Drawing Sheets

INTEGRATED CIRCUIT INCLUDING MEMORY CELL FOR STORING AN INFORMATION ITEM AND METHOD

CROSS-REFERENCE TO RELATED APPLICATIONS

This application claims foreign priority benefits under 35 U.S.C. §119 to co-pending German patent application number DE 10 2004 018 715.0, filed 17 Apr. 2004. This related patent application is herein incorporated by reference in its entirety.

BACKGROUND OF THE INVENTION

1. Field of the Invention

The invention relates to a memory cell for providing an information item having a programmable metallization cell (PMC) resistance component. The invention furthermore relates to a memory circuit having such a memory cell and to a method for producing a memory cell having a PMC resistance component.

2. Description of the Related Art

Semiconductor memory cells based on PMC resistance components are generally known. A PMC resistance component has a solid electrolyte material in which a conductive path can optionally be formed or withdrawn to assume a high-resistance or a low-resistance state that can be assigned to a logic state. Such memory cells based on a PMC resistance component are disclosed, for example, in the following documents: M. N. Kozicki, M. Yun, L. Hilt, A. Singh, *Applications Of Programmable Resistance Changes In Metal-Doped Chalcogenides*, Electrochemical Society Proc., Vol. 99-13 (1999) 298; R. Neale, *Micron To Look Again At Non-Volatile Amorphous Memory*, Electronic Engineering Design (2002) and B. Prince, *Emerging Memories—Technologies and Trends*, Kluwer Academic Publishers (2002).

PMC resistance components usually have a very high ratio of the resistance values of the low-resistance state and the high-resistance state, which is primarily governed by the very high-resistance state of the solid electrolyte material in the unprogrammed state, i.e., when the conductive path is not formed. Typical values for the high-resistance state are greater than $10^{10}$ ohms, while typical values for the low-resistance state are approximately $10^5$ ohms (given an active cell area of less than 1 $\mu m^2$ and an active layer thickness of approximately 50 nm).

For the individual cell, the high resistance ratio between high-resistance and low-resistance state is favorable for the evaluation of the state of the cell. However, in the realization of a memory cell array with evaluation and drive circuits, a number of disadvantages are associated with the above mentioned resistance values. First, the cells can be driven by low switching voltages whose typical values lie in the range of 50 mV to 300 mV. Cells in a cell array which are electrically insulated from a defined electrical potential such as the bit/word or plate lines (e.g., by means of the turned-off selection transistor or the extremely high-value resistance of the cell) are therefore very sensitive to noise which, when coupled in, may lead to inadvertent switching of the cell. Furthermore, application of signals to bit and word lines of the memory cell array, as a result of the capacitive coupling, may give rise to a voltage at the order of magnitude of the switching voltage of the non-selected cells as well. This effect primarily relates to memory cells whose solid electrolyte is in the high-resistance state.

An input of the read-out amplifier which is connected to the memory cell during read-out is usually realized with the aid of an operational amplifier with a feedback resistor. For good discrimination between the low-resistance and high-resistance state, the feedback resistor has to be adapted to the resistance of the cell. High resistance values result in this case and require a large area requirement, particularly when such a memory cell is realized using CMOS technology.

Furthermore, the high resistance values result in high RC time constants and very low current values for the detection of the high-resistance state. Thus, the evaluation of the state can be slowed down significantly.

Moreover, the cells exhibit degradation with regard to the high-resistance state over the service life, particularly under stress conditions, such as in the case of many read-in/read-out operations. This effect is described, for example, in the document R. Symanczyk et al., *Electrical Characterization of Solid State Ionic Memory Elements*, Proceedings Non-Volatile Memory Technology Symposium (2003). The degradation is manifested in a reduction of the resistance value in the high-resistance state and signifies an undesirable inhomogeneity of the cell properties in a memory cell array.

SUMMARY OF THE INVENTION

One aspect of the present invention provides an improved memory cell having a PMC resistance component. The memory cell is less sensitive to noise or signal crosstalk, has fewer degradation effects and can be read more simply.

Another aspect of the present invention provides a method for producing such a memory cell.

A first aspect of the present invention provides a memory cell for providing an information item, having a memory element. The memory element comprises a PMC resistance component with a solid electrolyte material, wherein the solid electrolyte material may be put into a first state with a high electrical resistance and into a second state with a low electrical resistance. The memory element further includes a resistance element which is connected to the PMC resistance component in such a way as to reduce the total resistance of the memory element in the first state.

In the first state, the cell is not electrically insulated from other potential lines of the memory circuit, and the cell thus becomes more sensitive to noise and signal crosstalk on account of instances of capacitive coupling. With regard to a read-out circuit to be provided, an operational amplifier with feedback resistor provided in the read-out circuit can be implemented more simply since the feedback resistor is adapted to the resistance of the memory element for optimum discrimination, and is thus significantly smaller than in the case of a pure PMC resistance component as memory element, which has a high resistance in the first state. The area requirement of such a feedback resistor can thereby be reduced. Moreover, the high RC time constant in the detection of the high-resistance state of the memory element may be reduced since the memory element has a lower resistance.

The resistance element may be connected in parallel with the PMC resistance component.

In accordance with one embodiment, to reduce the resistance value of the high-resistance state, the electrical resistance of the resistance element is less than the resistance value of the high-resistance state of the PMC resistance component. Furthermore, the electrical resistance of the resistance component may be greater than the resistance value of the low-resistance state of the PMC resistance component.

In accordance with one embodiment, the memory element is arranged on a substrate and comprises a first electrode and a second electrode, between which the solid electrolyte and the resistance element are arranged. The resistance element may be arranged in a passage opening through an insulator region between the first electrode and the second electrode, the resistance element having a further passage opening, in which the solid electrolyte is arranged between the first electrode and the second electrode.

The resistance element may contain doped silicon material or titanium nitride.

A further aspect of the present invention provides a memory circuit having a memory cell as described above. The memory cell is coupled to a read-out circuit to detect the state of the solid electrolyte material, the read-out circuit having a differential amplifier, which is provided with a feedback resistor set to the resistance of the memory element. The adapted feedback resistor may serve to achieve good discrimination between the first and second states.

A further aspect of the present invention provides a production method for producing a memory cell having a memory element, which has a PMC resistance component. In this case, firstly a first electrode is arranged on a substrate, and an insulation layer may be formed over the first electrode. A passage opening is introduced into the insulation layer to uncover a portion of the first electrode. A resistance material is arranged at least on an inner wall of the passage opening to form a resistance element. A solid electrolyte material is subsequently introduced in the passage opening to form a PMC resistance region. A second electrode is arranged on the resistance material and the solid electrolyte material so that the second electrode is connected both to the resistance material and to the solid electrolyte material, and thus, between the first and second electrodes, the resistance region and the PMC resistance region form two resistance regions connected in parallel with one another.

In accordance with one embodiment, an anisotropic etching method may be utilized to introduce the passage opening through the insulation layer.

In accordance with one embodiment of the invention, the resistance material may be set to the desired resistivity (e.g., by doped silicon) at least on an inner wall of the passage opening by admixture of dopants as early as during the deposition.

In accordance with an alternative embodiment, the resistance material may be deposited at least on an inner wall of the passage opening firstly in a pure form. Ion implantation is subsequently carried out to effect the doping and thus the setting of a desired resistivity for the material.

In accordance with a further embodiment, the resistance material is introduced into the cell by means of a so-called spacer process.

In accordance with an alternative embodiment, the resistance material may be deposited at least on an inner wall of the passage opening.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
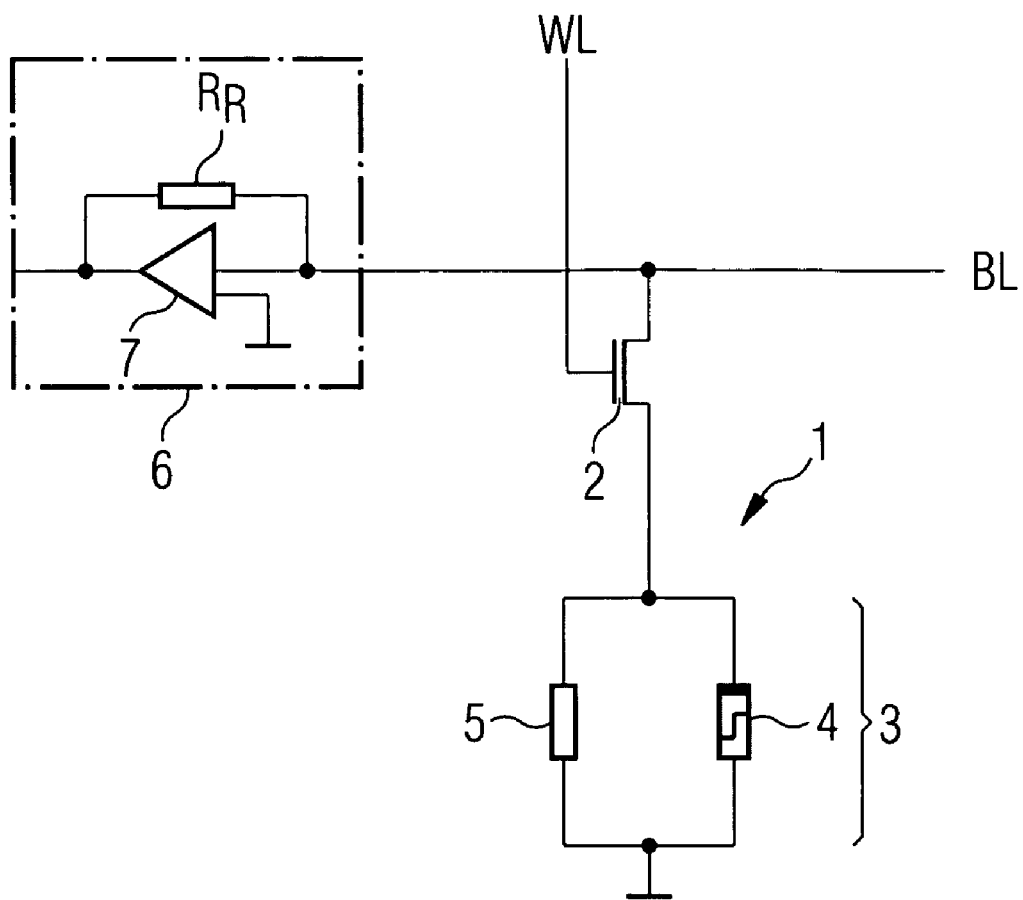
FIG. 1 shows a circuit diagram of a memory cell having a PMC resistance component, which memory cell is arranged on a word line and a bit line of a memory circuit.

FIG. 1 shows a circuit diagram of a memory cell 1 according to one embodiment of the invention arranged on a word line WL and on a bit line BL of a memory cell array having a plurality of word lines and a plurality of bit lines (not shown). The word line serves for selecting one of the memory cells on a specific bit line BL, so that the content of the memory cell situated on the activated word line can be read out via the bit line BL. For this purpose, the word line WL is connected to a control terminal of a switch 2 of the memory cell 1. The switch 2 of the memory cell 1 is usually formed by a field effect transistor, the word line WL being connected to the gate terminal of the field effect transistor. A first terminal, e.g., the drain terminal, of the field effect transistor is connected to the bit line, and a second terminal, e.g., the source terminal, is connected to a terminal of the memory element 3.

The memory element 3 has a PMC resistance component 4, which has a solid electrolyte material. A solid electrolyte material is a material, such as GeSe, in which ions of a specific conductive substance, in particular ions of a metal, e.g., silver ions, can move upon application of an electric field. Such a solid electrolyte material is also called chalcogenite. Two electrodes, i.e., an anode and a cathode, are provided for applying the electric field. The cathode is formed in inert fashion so that it cannot interact chemically with the metal ions or with the solid electrolyte. The anode is formed from a conductive material which can emit ions into the solid electrolyte material to form conductive regions there. By way of example, such a material may contain silver, in which case, upon application of a suitable electric field, silver ions penetrate into the solid electrolyte material and form conductive paths there between the two electrodes. Upon application of an opposite electric field, the silver ions are forced back to the anode and taken up again by the latter.

In this way, the solid electrolyte material may be programmed with different resistances depending on whether or not electrically conductive regions are formed in the solid electrolyte material.

Given an active cell area of less than 1 $\mu m^2$, typical values for a high-resistance state are greater than $10^{10}$ ohms, and typical values for a low-resistance state are approximately $10^4$ ohms to $10^6$ ohms. This high ratio between high-resistance and low-resistance states is favorable for the evaluation of the state of the cell and affords a sufficient security in the case of technological fluctuations and the like. Very low switching voltages are necessary for the memory cell, particularly for writing and read-out, and the low switching voltages may be sensitive to noise and signal crosstalk due to capacitive coupling that range in the order of magnitude of the switching voltage. To read out the content of the memory cell, i.e., the logic state assigned to a resistance value of the memory cell, a read-out amplifier 6 is provided. The read-out amplifier may include a differential amplifier 7 and, for optimum discrimination between the logic states of the memory cell, a feedback resistor $R_R$, the order of magnitude of which is adapted to the resistance of the memory cell. In particular, optimum discrimination of the high-resistance state of the memory cell necessitates providing a very large feedback resistor $R_R$, which may need a high space requirement when realized using CMOS technology. High RC time constants are formed in the high-resistance state of the memory cell, which may slow down propagation times of signals and thus reduce the speed of reading into and out of the memory cell 1.

To reduce the total resistance of the memory element 3 in the high-resistance state of the PMC resistance component 4, a resistance element 5 is connected in parallel with the PMC resistance component 4. The resistance element 5 may have a resistance value which ranges between the resistance values of the low-resistance state and the high-resistance state of the PMC resistance component 4. What is intended to be achieved, in particular, is that, in the high-resistance state of the PMC resistance component 4, the resistance assigned to the high-resistance state is principally determined by the resistance value of the resistance element 5. Also, if the PMC resistance component 4 is in the low-resistance state, then the resistance value of the low-resistance state is intended to determine the resistance value of the memory element 3.

Figure 2:
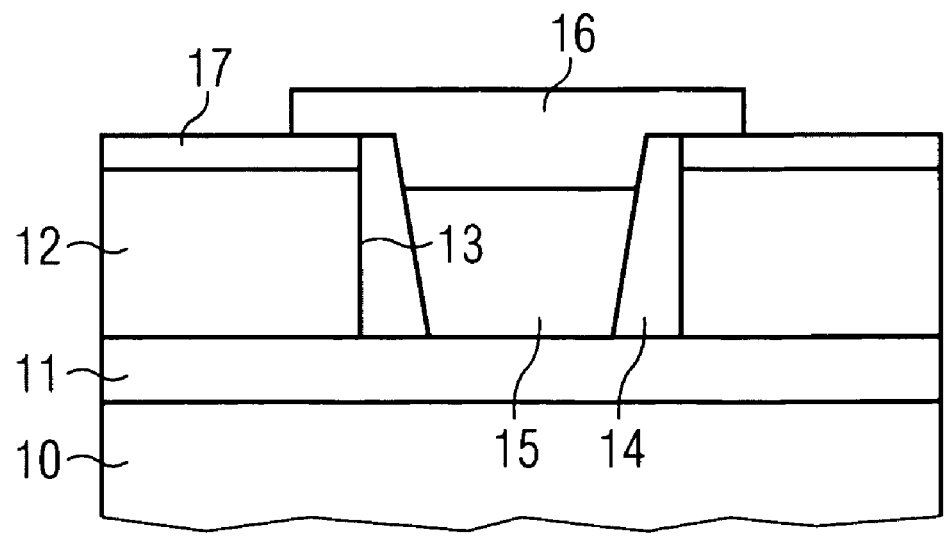
FIG. 2 shows a layer construction of a memory element for a memory cell according to one embodiment of the invention.

FIG. 2 schematically illustrates the construction of a memory element 3 for the memory cell 1 on a semiconductor substrate 10. A first electrode 11 is applied in planar fashion on the semiconductor substrate 10, which may be in particular a crystalline silicon material or an arbitrary other carrier material. An insulation material 12, which is likewise applied in planar fashion, is situated on the first electrode 11. A passage opening 13 is formed in the insulation material 12, and the memory element is introduced into the passage opening. The memory element is formed by a resistance region 14 and a solid electrolyte region 15, which are arranged generally next to one another in the passage opening 13. In this case, the material of the resistance region 14 is situated on the inner wall of the passage opening 13 and is in contact with the first electrode 11. The resistance region 14 forms a further passage opening in the interior of the resistance region 14 which is filled with the solid electrolyte material 15. The solid electrolyte material 15 is likewise electrically conductively connected to the first electrode 11. There are diverse possibilities for arranging the resistance region 14 and the solid electrolyte material 15 in the passage opening as long as the resistance region 14 and the solid electrolyte material 15 are at least partially connected in parallel with one another. A second electrode 16 is applied over the passage opening 13 such that it makes electrical contact with both the resistance region 14 and the solid electrolyte material 15. The resistance region 14 and the solid electrolyte 15 are thus arranged between the first electrode 11 and the second electrode 16 in such a way as to produce a parallel circuit formed by their respective nonreactive resistances.

The resistance region may be realized for example with doped silicon or titanium nitride, wherein the resistance value of the resistance region may be set exactly by admixture of impurities during deposition.

Figure 3A:
FIGS. 3A to 3I show stages of a production method for a memory cell in accordance with one embodiment of the invention.
Figure 3B:
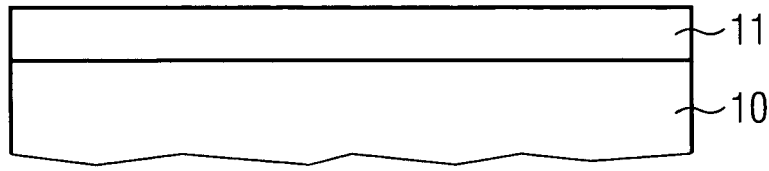
Figure 3C:
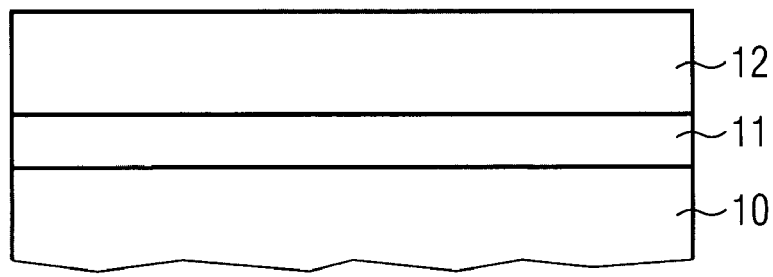

FIGS. 3A to 3I illustrate the stages of a production method for a memory cell according to one embodiment of the invention. FIG. 3A illustrates a substrate 10, on which the memory cell according to one embodiment of the invention is to be applied. Firstly, a first electrode 11 is deposited onto the semiconductor substrate 10 in planar fashion utilizing suitable deposition methods, with the result shown in FIG. 3B. As is illustrated in FIG. 3C, an insulation layer 12 is applied to the first electrode 11 in planar fashion, which insulation layer may contain for example $SiO_2$, $Si_3N_4$ or similar insulating materials.

The first electrode 11 may comprise the material tungsten and be patterned in a suitable manner for a contact-connection and insulation with respect to adjacent memory cells and/or circuit structures. Other conductive materials may also be used.

Figure 3D:
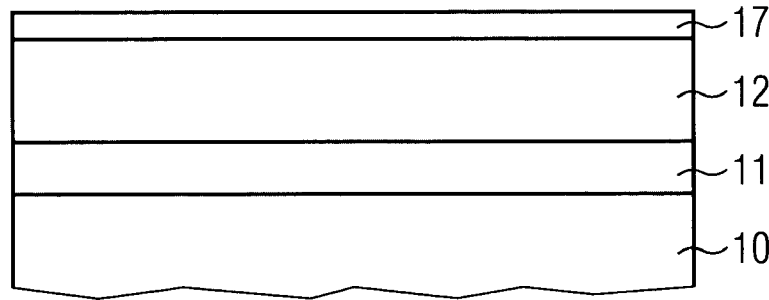
Figure 3E:
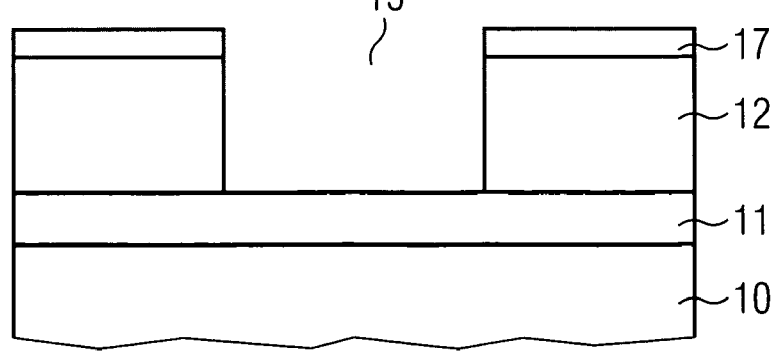

As illustrated in FIG. 3D, an optional stop layer 17 for an etching process is applied to the insulation layer 12. The stop layer maybe removed from the insulation layer 12 in a passage region 13 utilizing a suitable lithography step. In a subsequent, generally anisotropic, etching process, the insulation layer 12 is etched away through the uncovered region of the stop layer 17, until the first electrode 11 is uncovered in the passage region 13, as illustrated in FIG. 3E. One possible anisotropic etching method is wet-chemical etching.

Figure 3F:
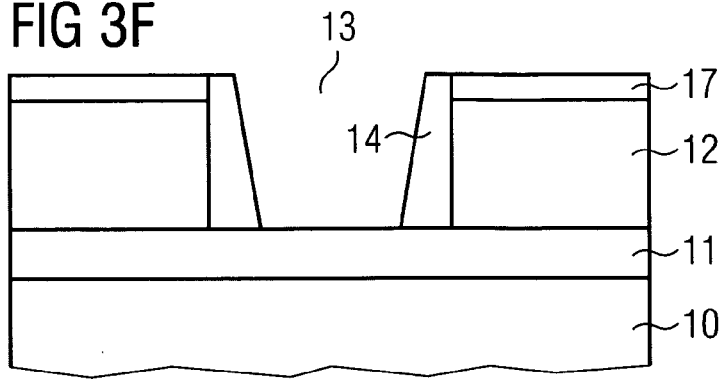

In accordance with FIG. 3F, a so-called spacer layer may be applied to the inner walls of the passage opening 13. The spacer layer is in contact with the first electrode but does not completely cover the latter. The production of the spacer layer may comprise two steps: conformal deposition and anisotropic etching (the individual steps are not shown here). The spacer layer forms the resistance region 14 and may contain materials such as doped silicon, titanium nitride, aluminum or the like, which may set the resistance of the resistance region 14 as accurately as possible. The resistance region 14 constricts the passage opening 13, thereby forming a further passage opening to the first electrode 11. The spacer layer may be produced by deposition onto the inner walls of the passage opening 13.

Figure 3G:
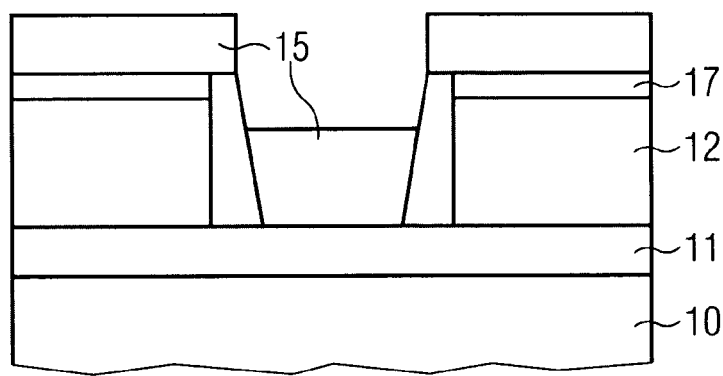
Figure 3H:
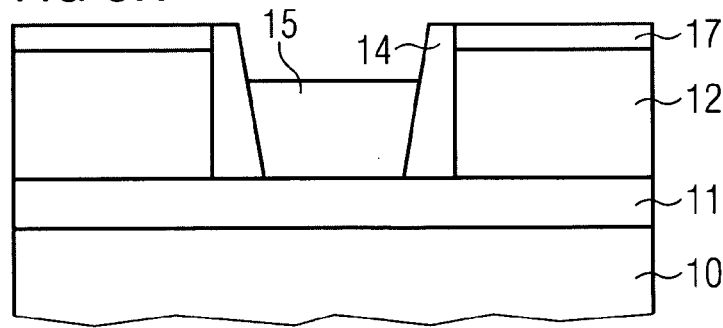
Figure 3I:
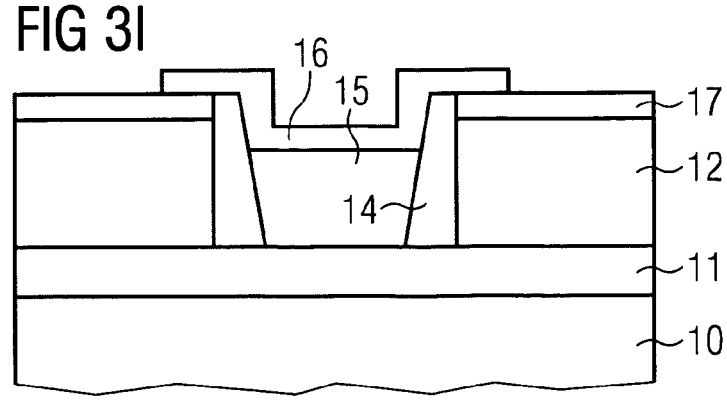

In a subsequent process step, as is illustrated in FIG. 3G, a solid electrolyte material 15 is deposited in planar fashion. The solid electrolyte material 15 may be deposited both on the etching stop layer 17, on the insulation layer 12 and in the further passage opening. As is illustrated in FIG. 3H, the solid electrolyte material 15 is removed from the surface of the etching stop layer 17 with the aid of a suitable method, resulting in that only that part of the solid electrolyte material 15 which is situated in the passage opening 13 remains. The removal of the solid electrolyte material 15 may be carried out, e.g., utilizing a chemical mechanical polishing (CMP) method. As illustrated in FIG. 3I, the second electrode 16 is applied to the structure thus formed such that it is situated at least above the passage region 13, and is in electrically conductive contact with the resistance region 14 and also with the solid electrolyte material 15. The solid electrolyte material 15 may be deposited as a monolayer or alternatively, as a multilayer, e.g., as a GeSe/Ag or GeS/Ag layer sequence.

The steps illustrated in FIG. 3F may be processed alternatively in other ways for setting the desired resistance value. Firstly admixture of suitable dopants and doping concentrations during the deposition of the spacer layer may be utilized. Secondly, deposition and anisotropic etching of the undoped spacer material may be utilized, followed by subsequent introduction of the dopants, for example, by implantation.

Alternative configurations of the memory element thus formed are also possible as long as a resistance region and a solid electrolyte region which form resistances that are connected in parallel with one another at least partially are respectively situated between the first electrode and the second electrode.

While the foregoing is directed to embodiments of the present invention, other and further embodiments of the invention may be devised without departing from the basic scope thereof, and the scope thereof is determined by the claims that follow.

What is claimed is:

1. An integrated circuit comprising:
a memory element comprising:
   a programmable metallization cell (PMC) resistance component having a solid electrolyte material, wherein the solid electrolyte material is selectably configurable into a first state having a high electrical resistance and into a second state having a low electrical resistance;
   a resistance element connected to the PMC resistance component in such a way as to reduce the total resistance of the memory element in the first state; and
   wherein the resistance element is connected in parallel with the PMC resistance component.

2. The integrated circuit of claim 1, wherein an electrical resistance of the resistance element is greater than a resistance value of the PMC resistance component in the second state.

3. The integrated circuit of claim 1, wherein the memory element is arranged on a substrate and further comprises a first electrode and a second electrode, wherein the solid electrolyte material and the resistance element are arranged between the first electrode and the second electrode.

4. The integrated circuit of claim 3, wherein the first electrode is arranged on the substrate, wherein an insulator region is arranged on the first electrode, wherein the second electrode is arranged on the insulator region, wherein the insulator region has a passage opening, wherein the resistance element is arranged at least partly on an inner wall of the passage opening, and wherein the solid electrolyte material is provided in the passage opening and arranged in electrical connection between the first electrode and the second electrode.

5. The integrated circuit of claim 4, wherein the resistance element comprises doped silicon.

6. The integrated circuit of claim 4, wherein the resistance element comprises doped titanium nitride.

7. The integrated circuit comprising:
a memory element comprising:
   a programmable metallization cell (PMC) resistance component having a solid electrolyte material, wherein the solid electrolyte material is selectably configurable into a first state having a high electrical resistance and into a second state having a low electrical resistance;
   a resistance element connected to the PMC resistance component in such a way as to reduce the total resistance of the memory element in the first state; and
   wherein an electrical resistance of the resistance element is less than a resistance value of the PMC resistance component in the first state.

8. A memory circuit, comprising:
a memory cell for storing an information item comprising
   a memory element, the memory element comprising:
   a programmable metallization cell (PMC) resistance component having a solid electrolyte material, wherein the solid electrolyte material is selectably configurable into a first state having a high electrical resistance and into a second state having a low electrical resistance; and
   a resistance element connected to the PMC resistance component in such a way as to reduce the total resistance of the memory element in the first state; and
   a read-out circuit coupled to the memory cell to detect a state of the solid electrolyte material, the read-out circuit comprising a differential amplifier and a feedback resistor connected between an input and an output of the differential amplifier.

9. The memory circuit of claim 8, wherein the feedback resistor has a resistance set correspondingly to a resistance of the memory element.

10. The memory circuit of claim 8, wherein the resistance element is connected in parallel with the PMC resistance component.

11. The memory circuit of claim 10, wherein an electrical resistance of the resistance element is less than a first resistance value of the PMC resistance component in the first state and greater than a second resistance value of the PMC resistance component in the second state.

12. The memory circuit of claim 11, wherein the memory element is arranged on a substrate and further comprises a first electrode and a second electrode, wherein the solid electrolyte material and the resistance element are arranged between the first electrode and the second electrode.

13. The memory circuit of claim 12, wherein the first electrode is arranged on the substrate, wherein an insulator region is arranged on the first electrode, wherein the second electrode is arranged on the insulator region, wherein the insulator region has a passage opening, wherein the resistance element is arranged at least partly on an inner wall of the passage opening, and wherein the solid electrolyte material is provided in the passage opening and arranged in electrical connection between the first electrode and the second electrode.

14. The memory circuit of claim 13, wherein the resistance element comprises one of doped silicon and doped titanium nitride.

15. The memory circuit of claim 8, wherein the memory cell further comprises a switch connected between the memory element and a bit line which is connected to the read-out circuit, the switch operatively connected to a word line and controlled by a signal on the word line.

16. A method for producing a memory cell having a memory element, the method comprising:
   arranging a first electrode on a substrate;
   arranging an insulation layer over the first electrode;
   forming a passage opening in the insulation layer which uncovers a portion of the first electrode;
   arranging a resistance material at least on an inner wall of the passage opening to form a resistance region;
   arranging a solid electrolyte material into the passage opening to form a programmable resistance region; and
   arranging a second electrode on the resistance material and the solid electrolyte material,
   whereby a programmable metallization cell (PMC) resistance component and a resistance element of the memory element are formed, and
   wherein the resistance region extends from the first electrode to the second electrode.

17. The method of claim 16, wherein the passage opening is formed utilizing an anisotropic etching method.

18. The method of claim 16, wherein the resistance material is arranged on the inner wall of the passage opening utilizing ion implantation into the insulation layer.

19. The method of claim 18, wherein the resistance material is formed in a remaining portion of the passage opening.

* * * * *